United States Patent [19]
Popall et al.

[11] Patent Number: 5,734,000
[45] Date of Patent: Mar. 31, 1998

[54] SILICON BASED LACQUER, ITS USE AS A SUBSTRATE COATING AND SUBSTRATES THUS OBTAINED

[75] Inventors: Michael Popall, Wurzburg; Jochen Schulz; Birke Olsowski, both of Veitshochheim; Monika Pilz, Kleinrinderfeld, all of Germany

[73] Assignees: E.I. DuPont de Nemours & Company; Fraunhofer-Gesellschaft Zur Forderung, Munich, Germany

[21] Appl. No.: 351,357

[22] PCT Filed: Jun. 5, 1993

[86] PCT No.: PCT/EP93/01428

§ 371 Date: Feb. 13, 1995

§ 102(e) Date: Feb. 13, 1995

[87] PCT Pub. No.: WO93/25604

PCT Pub. Date: Dec. 23, 1993

[30] Foreign Application Priority Data

Jun. 10, 1992 [FR] France ................... 92 07006

[51] Int. Cl.$^6$ .................................................. C08G 77/04
[52] U.S. Cl. ................. 528/32; 528/10; 427/387; 427/515; 428/447
[58] Field of Search .................... 528/10, 3; 427/515, 427/508, 387

[56] References Cited

U.S. PATENT DOCUMENTS

| | | | |
|---|---|---|---|
| 4,238,590 | 12/1980 | Scholze et al. | 528/5 |
| 4,243,692 | 1/1981 | Scholze et al. | 427/2 |
| 4,374,696 | 2/1983 | Schmidt et al. | 156/329 |
| 4,840,666 | 6/1989 | Schmidt et al. | 106/14.05 |
| 4,944,964 | 7/1990 | Schmidt et al. | 427/303 |
| 5,401,528 | 3/1995 | Schmidt | 427/2.26 |

FOREIGN PATENT DOCUMENTS

| | | |
|---|---|---|
| 0036648 | 9/1981 | European Pat. Off. . |
| 0185893 | 7/1986 | European Pat. Off. . |
| 0223067 | 5/1987 | European Pat. Off. . |
| 2413415 | 7/1979 | France . |
| 2413416 | 7/1979 | France . |
| WO 92/16183 | 10/1992 | WIPO . |

OTHER PUBLICATIONS

English translation of JP-A-343407/1992; U.S. Pat. No. 5,401,528 is a counterpart to PCT/EP92/00604.

*Primary Examiner*—Ralph H. Dean
*Attorney, Agent, or Firm*—Morgan & Finnegan, LLP

[57] ABSTRACT

A silicon-based lacquer is obtained by precondensation of a silicon compound and organic silanes followed by hydrolysis of the precondensate.

55 Claims, 2 Drawing Sheets

SILICON BASED LACQUER, ITS USE AS A SUBSTRATE COATING AND SUBSTRATES THUS OBTAINED

The present invention relates to a novel silicon based lacquer, its use as a substrate coating, and the thus-obtained substrates.

Hitherto, studies and efforts have been made to obtain lacquers endowed with improved technical properties, to be used as coatings for substrates which are typically used in extremely harsh environments. Examples of coatings which allow the coated substrates to be used in said harsh environment are coatings with properties such as: anti-contamination, anti-scratch, heat-resistance and refractory properties, low moisture permeability, resistance to chemicals, insulation properties, oxygen-barrier, high bulk resistivity, low friction coefficient, high adhesion on the substrates and the like.

The fields wherein said coatings may be used are various and numerous. One can cite, as illustrative, those fields wherein the coatings are protecting for active and passive electric, electronic, optical components and assemblies thereof against environmental stresses.

During the past years, research in the field of microelectronics has been directed to higher productivity and devices miniaturisation. Thus, the use of surface-mounted devices (SMD), rendering high-speed component placement possible, has lead to significant gain in productivity, the soldering of such surface mounted devices (SMD) on the printed circuits now being carried out on the face(s) of the circuit where the devices are lodged. The two soldering processes currently used are wave soldering and reflow soldering. The first of these two processes, the so-called wave soldering process, comprises the step of bringing the printed circuit bearing the SMDs adhered thereon into contact with a stationary wave within a flowing molten solder bath, the parameters of temperature and time being respectively about 260° C. and about 10 s. The second process, so-called reflow soldering comprises the step of applying solder in the solid state at the contact pins of the SMD adhered on the printed circuit board followed by heating, using IR radiation or vapor phase transfer, of the foregoing assembly at a temperature of about 220° C. for a period of time of about 30 s. The component and the substrate are thus submitted to somewhat drastic thermal conditions, but they must of course retain their properties, especially electronic properties, i.e. the shift due to the thermal treatment should be less than a few percent, typically less than 3%.

Concurrently, efforts have been directed to miniaturise the components themselves and new components such as new capacitors, have been developed. These new capacitors known as thin-film capacitors are obtained by laminating thin layers of metal, e.g. aluminium, and thin layers of a bulk dielectric material, the electrode pins of this SMD being obtained by deposition of metal, e.g. aluminium. Good and promising results have been obtained with such capacitors, obtained from films made of polyester e.g. polyethylene-terephtalate (PET) or polyethylenenaphtalate (PEN) and which have been metallized. An example of a manufacturing process of said new capacitors is the process known as Interleaf®. Processes for preparing thin-film capacitors are described in the following U.S. Pat. Nos. 4,741,876, 4,744, 462, 4,533,813, 4,535,381, 4,531,268, 4,534,488, and 4,531,340.

However, these new components, such as the above thin-film capacitors suffer from certain drawbacks. One is that polyester foils are known to absorb water. This water will cause corrosion and erosion of aluminium electrodes (the metal foils), and also a capacitance shift which occurs due to moisture content changes, meaning that during the above-mentioned soldering processes the rapid evaporation of water will tend to cause delamination.

These problems connected with water are cumulated with the low melting-point of the polyester. Therefore, the use of thin film capacitors as microelectronic SMD which can withstand the soldering processes requires encapsulation of these thin films. The encapsulating casing has to be endowed with insulation properties in order to protect the SMD. But now the benefit gained thanks to the miniaturisation of the capacitors is lost, due to the bulkiness of the insulation casing.

An alternative has thus been proposed in order to avoid the use of said insulating casing. It is based on the coating of the component SMD e.g. the capacitor, with a material which could act as a barrier and thus prevent degradation of the SMD. But the properties required are multiple. Major properties, among others, are, in the case of the above-mentioned SMD such as a thin film capacitor: efficiency at low thickness, high adhesion on the substrate such as aluminium and polyester, low permeability to moisture, thermal properties sufficient to withstand drastic soldering conditions, electrical properties such as high surface and bulk resistance and high breakdown voltage, chemical properties like solvents and soaps resistance, easy application on the substrates, absence of harmfulness to the environment and the like. Various materials have been provided, such as polyvinylchloride (PVC), high density polyethylene (HDPE) and the like, as coating for SMDs and similars, but the results thus obtained are not satisfying. These materials, known as water barrier materials, are not adherent to the substrate, made from, e.g. polyester, silicon, ceramic, metal, and the like and are not able to withstand high temperatures.

Similar and other problems arise with a wide variety of SMDs, as well as with optical devices, printed circuit boards, and the like. Examples of substrates contemplated within the scope of the present invention are, by way of illustration: resistors, integrated circuits, optical waveguides and switches, multichip modules (MCMs), Si-wafers, printed circuit boards (PCBs) such as PCBs based on FR-4 laminates or $Al_2O_3$-ceramic boards with Cu- and Au-conductor lines, and hybrid circuits.

Also, enhanced integration, faster signal transmission, similarly to the reduced size of SMD, requires new patternable materials. The potential of new generations of RAM and ROM chips, especially processors, cannot be fully used without enhanced integration and multilayer technology. Therefore microelectronics requires tailormade materials and new techniques for interconnection. Multilayer technology demands patternable dielectric materials with specific properties, such as: high breakdown voltage, low permittivity constant, high bulk resistance, high corrosion resistance, high adhesion to various types of substrates, and the like. Such materials, endowed with the afore-mentioned properties, applied as coating and further processed, would open new developments for very large system integration techniques (VLSI).

The foregoing examples show a need for a variety of coatings endowed with improved properties. But, a unique coating to be used as a coating in merely all cases would be most advantageous. This would allow, for example, the processing in one time of the PCBs with all SMDs arranged thereon. Attempts have been made to reach a coating with numeral properties, but the results obtained so far are not promising.

EP-A-0036648 describes a polycondensate for use as a heat-sealing agent. This polycondensate is obtained by polymerizing: a) a silane of the formula $SiX_4$, b) a silane of the formula $R'_m(R''Y)_n SiX_{(4-m-n)}$ wherein Y is a polymerizable group, c) a silane of the formula $R''_p SiX_{4-p}$ and d) a low-volatility oxide. There is no mention of specific use as a coating for electronic or optical devices.

EP-A-0223067 describes an adhesive composition comprising the polycondensate such as described in EP-A-0036648, copolymerized with a second monomer in the presence of a polymerization catalyst. Again there is no mention of a coating for substrates.

The aim of the invention is to provide said "universal" coating, thanks to a new lacquer to be applied.

Figure 1A:
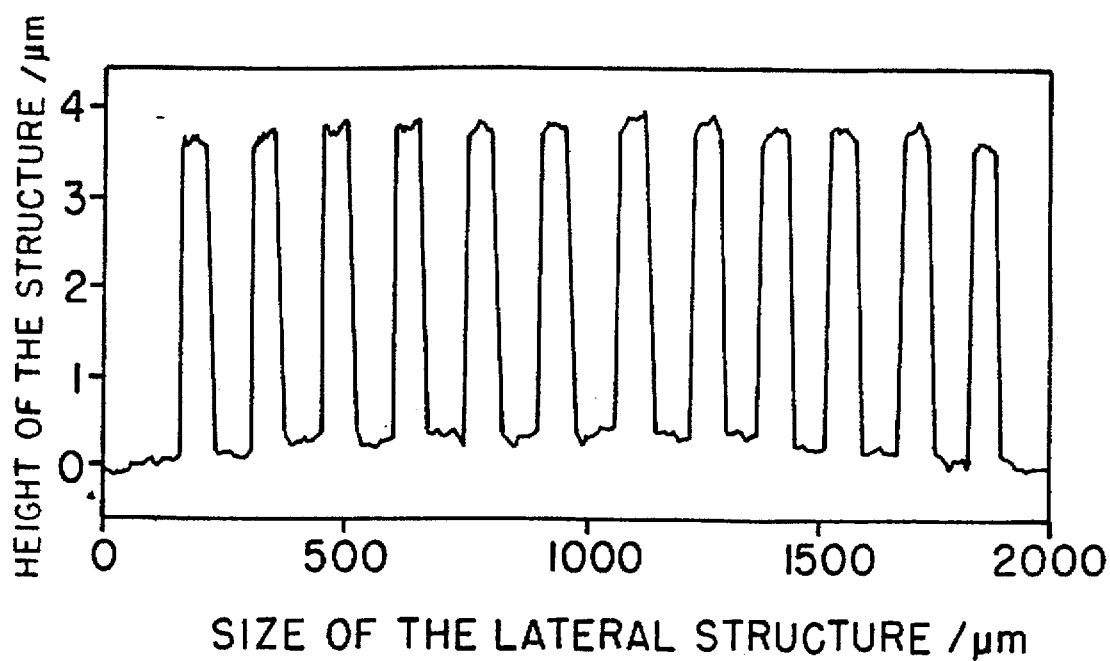
FIGS. 1(a) and 1(b) shows the planarization of the coating on an $Al_2O_3$-substrate with Cu- and Au-conductors.

Thus, the present invention provides a lacquer obtained by the process comprising the steps of:

(i) precondensation of:
  a) 1 to 10 mol % of at least one silicon compound of the formula I:

$$SiR_4 \qquad (I)$$

wherein:
  R is halogen, hydroxy, alkoxy, acyloxy, or chelated ligand;

b) 20 to 94 mol % of at least one organic silane of the formula II:

$$R'''_m(R''Y)_n SiX_{(4-m-n)} \qquad (II)$$

wherein
  R'' is alkyl, alkenyl, aryl, alkylaryl, arylalkyl, alkenylaryl, arylalkenyl,
  R''' is alkylene, alkenylene, arylene, alkyl-arylene, arylalkylene, alkenylarylene, arylalkenylene, R'' and R''' being optionally interrupted by oxygen, sulfur, or —NH—,
  X is hydrogen, halogen, hydroxy, alkoxy, acyloxy, —NR$_2$' where R' is H or alkyl,
  Y is a polymerizable group,
  m and n are integers from 0 to 3; m+n is from 1 to 3; and c) 5 to 30 mol % of at least one organic silane of the formula III:

$$R''_p SiX_{4-p} \qquad (III)$$

wherein R'' and X have the above meaning, and p is 1, 2 or 3; and optionally d) 0 to 10 mol % of at least one low-volatility metal oxide, soluble in the reaction medium, of an element of main groups Ia to Va or sub-groups IVb or Vb, or a compound of one of these elements, soluble in the reaction medium, forming a low-volatility oxide; preferably in the absence of water, optionally in the presence of an organic solvent at a temperature comprised between 0° and 90° C. for a period of time comprised between 0.5 and 48 h; and (ii) hydrolysis condensation of the precondensate of step (i) with substantially the stoichiometric amount of water, at a temperature comprised between 0° and 100° C. for a period of time comprised between 1 and 72 h.

Preferably, the component a) of formula I represents from 2 to 6 mol %, the component b) of formula II represents 69 to 83 mol %, the component c) of formula III represents 15 to 25 mol %, and the component d) is absent.

In the above formulas I, II and III, the groups R, R', R'', X or Y which may be present several times in one or more compound(s), may have the same meaning or different meanings. Thus, for example, the group X in formulas II and III may be methoxy in both formulas or methoxy in formula II and hydroxy in formula III. Also, the group R in formula I may have from four distinct meanings to one unique meaning.

The term "alkyl", as used herein, is intended to mean, but is not limited, to saturated, straight, branched or cyclic groups having from 1 to 20, preferably from 1 to 10 carbon atoms, more preferably from 1 to 6; the most preferred groups are lower alkyl groups containing 1 to 4 carbon atoms. Examples of such groups are, by way of illustration: methyl, ethyl, n-propyl, isopropyl, n-butyl, sec-butyl, tert-butyl, isobutyl, n-pentyl, n-hexyl and cyclohexyl.

The term "aryl", as used herein, is intended to mean aromatic groups having from 6 to 25, preferably 6 to 14, and most preferably 6 to 10 carbon atoms. Examples are phenyl and naphthyl; phenyl being the preferred aryl group.

The term "alkenyl", as used herein, is intended to mean mono- or poly-unsaturated, straight, branched or cyclic group having from 2 to 20, preferably 2 to 10, more preferably 2 to 6 carbon atoms. Examples of such groups are: allyl, 2-butenyl and vinyl.

The groups alkylaryl, arylalkyl, alkenylaryl, arylalkenyl, alkylene, alkenylene, arylene, alkylene-arylene, arylene-alkylene, alkenylene-arylene, arylene-alkenylene, alkoxy, acyloxy, alkylamino, dialkylamino, amides, alkylcarbonyles, alkoxycarbonyles and the like are derived from the above mentioned alkyl, aryl and alkenyl groups, according to the nomenclature well-known to the man skilled in the art. Examples of such groups are: methoxy, epoxy, n- and i-propoxy, n-sec- and tert-butoxy, isobutoxy, β-methoxyethoxy, acetyloxy, propionyloxy, monomethylamino, monoethylamino, dimethylamino, diethylamino, ethylene, propylene, butylene, phenylene, toluylene, benzyl, styryl, methylcarbonyl, ethylcarbonyl, methoxycarbonyl and ethoxycarbonyl.

The above groups may be substituted by one or more usually employed substituants, such as halogen, lower alkyl, hydroxy, nitro, amino, and the like. The term "halogen" as used herein intends to mean fluorine, chlorine, or bromine, chlorine being preferred.

The silicon compound a) of the formula I is:

$$SiR_4 \qquad (I)$$

wherein: R is halogen, hydroxy, alkoxy, acyloxy or chelated ligand; and is also referred to as the "inorganic network former".

Examples of inorganic network former silanes are, by way of illustration: $SiCl_4$, $HSiCl_3$, $Si(OCH_3)_4$, $Si(OOCH_3)_4$ and $Si(OC_2H_5)_4$. The preferred group is $Si(OC_2H_5)_4$, i.e. tetraethoxysilane, referred to herein after as TEOS or T.

The silane b) of the formula II is:

$$R'''_m(R''Y)_n SiX_{(4-m-n)} \qquad (II)$$

wherein:

R" is alkyl, alkenyl, aryl, alkylaryl, arylalkyl, alkenylaryl, arylalkenyl, preferably methyl;

R'" is alkylene, alkenylene, arylene, alkylene-arylene, arylene-alkylene, alkenylene-arylene, arylene-alkenylene, preferably $C_{1-4}$ alkylene R" and R'" being optionally interrupted by oxygen, sulfur, or —NH—, X is hydrogen, halogen, hydroxy, alkoxy, acyloxy, —NR$_2$' where R' is H or alkyl, preferably $C_{1-4}$ alkoxy Y is a polymerizable group, preferably methacryloxy, acryloxy, epoxy, vinyl, allyl;

m and n are integers from 0 to 3, preferably 0 and 1 respectively;

m+n is from 1 to 3;

and is also referred to as the "organic network former". The bridging group R'" may optionally be interrupted by heteroatoms, such as oxygen, sulfur, and nitrogen, as —NH—. Thus, 2 to 10 recurring units, such as polyethers, can be advantageously obtained.

Examples of a functional organic network former are:

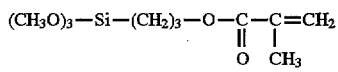

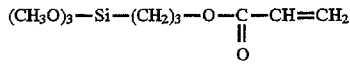

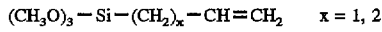

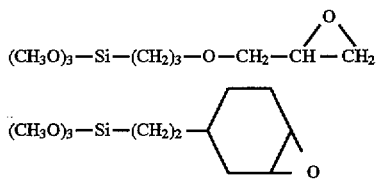

Preferably, component b) of formula II is $(R'''Y)SiX_3$, wherein R'" is a $C_{1-4}$ alkylene, Y is acryloxy, methacryloxy, glycidyloxy, vinyl, allyl, epoxycyclohexyl, and X is $C_{1-4}$ alkoxy. Most preferred groups are: 3-glycidyloxypropyltrimethoxysilane and 3-methacryloxypropyltrimethoxysilane, respectively abbreviated as glymo (G) and memo (M) hereinafter.

The silane c) of the formula III is:

wherein R", X and p have the above meaning, and is also referred to as the "network modifier".

Examples are, by way of illustration: $CH_3$—Si—$Cl_3$, $CH_3$—Si—$(OC_2H_5)_3$, $C_2H_5$—Si—$Cl_3$, $C_2H_5$—Si—$(OC_2H_5)_3$, $CH_2$=CH—Si—$(OC_2H_5)_3$, $CH_2$=CH—Si—$(OC_2H_4OCH_3)_3$, $CH_2$=CH—Si—$(OOCCH_3)_3$, $(CH_3)_2$—Si—$Cl_2$, $(CH_3)_2$—Si—$(OC_2H_5)_2$, $(C_2H_5)_2(Si$—$(OC_2H_5)_2$, $(CH_3)(CH_2$=CH)—Si—$Cl_2$, $(CH_3)_3$—Si—$C_1$, $(C_2H_5)_3$—Si—Cl, $(t$-$C_4H_9)(CH_3)_2$—Si—Cl, $(CH_3)_2(CH_2$=CH-$CH_2)$—Si—Cl, $(CH_3)_2$—Si$(OCH_3)_2$, $(CH_3)_2$—Si—$(OCH_3)_2$, $(C_6H_5)_2$—Si—$Cl_2$, $(C_6H_5)_2$—Si—$(OC_2H_5)_2$, $CH_2$=CH—Si—$Cl_3$, $CH_2$=CH-$CH_2$—Si—$(OC_2H_5)_3$, $CH_2$=CH—$CH_2$—Si—$(CH_3COO)_3$, $(i$-$C_3H_7)_3$—Si—OH and $(C_6H_5)_2$—Si—$(OH)_2$. Preferably, p is 2; R" is aryl and X is hydroxy or $C_{1-4}$ alkoxy. The most preferred network modifier is $(C_6H_5)_2$—Si—$(OH)_2$, diphenylsilanediol, hereinafter abbreviated as P2.

The silanes are either commercially available, or are readily prepared according to methods well-known by people skilled in the art; see for example W. Noll "Chemie und Technologie der Silicone", Verlag Chemie GmbH, Weinheim, Bergstrasse (1968). Care should be taken that the silanes are pure; trace amounts of electrolytes such as Cl, B, Ca, Ti, and the like adversely affect the reaction conditions and the properties of the thus-obtained lacquer.

In lieu of the silane monomers (a), (b) or (c), their respective oligomers may also be used. These oligomers are soluble in the reaction medium and they are partial precondensates. These partial precondensates, or linear or cyclic polyorganosiloxanes have a low molecular weight, the condensation rate ranging from 2 to 100.

As the optional component (d), one can use low-volatility oxides, soluble in the reaction medium of an element of main groups Ia to Va or sub-groups IVb or Vb of the Periodic Table, or alternatively one compound of one of these elements, soluble in the reaction medium, forming a low volatility oxide as previously described under the reaction conditions. Preferably, component (d) is obtained starting from one of the following elements: Na, K, Mg, Ca, B, Al, Sn, Pb, P, As, Sb and/or V; more preferred are Na, K, Ca, Mg, B, Al, Sn, As and P.

Among the low-volatility oxides, the preferred oxides are $Na_2O$, $K_2O$, CaO, $SnO_2$, $As_2O_3$, $PO_2O_5$, $B_2O_3$. $B_2O_3$ is most preferred.

The compounds soluble in the reaction medium and forming the above-mentioned low-volatility oxides are numerous. Mineral acids are suitable, such as phosphonic acid, boric acid, as well as their esters, halogenides and salts. Also suitable are the hydroxides such as NaOH, KOH or $Ca(OH)_2$, halogenides such as $SnCl_4$ and $PCl_5$, and alcoholates such as NaOR, KOR, $Ca(OR)_2$ or $Al(OR)_3$, the group R being derived from a lower alcohol such as methanol, ethanol, propanol and butanol. Starting compounds which may optionally be used are the corresponding salts with volatile acids, such as acetates, basic acetates, basic lead acetate and formiate.

In order to achieve the condensation leading to the heteropolycondensate forming the lacquer, the starting components a), b), c) and optionally d), according to the desired amounts and ratios are firstly subjected to a precondensation step. This step is carried out preferably in the absence of water, optionally in the presence of an organic solvent, which may be inert under the reaction conditions. This organic solvent is, for example, an alcohol, such as methanol, ethanol, propanol, butanol, an ether, such as dimethoxyethane, an ester such as dimethylglycolacetate, or a ketone such as acetone or methylethylketone. Preferably, the precondensation step is carried out without any external organic solvent. This step is preferably carried out without external addition of water, the water which is present in the reaction medium resulting from the condensation reaction of the OH-groups of diphenylsilanediol (component c), and also of the OH-groups with alkoxy-groups. This water may start subsequent condensation of the other components, but to a minor extent.

The precondensation may be carried out in the presence of a catalyst, for example compounds generating proton H$^+$ or hydroxyl ions OH$^-$ as well as amines. Examples of H$^+$-generating compounds are organic or mineral acids, such as hydrochloric acid, sulfuric acid, phosphoric acid, acetic acid and formic acid. Example of OH$^-$-generating compounds and of amines are ammonia, hydroxides of alkaline or alkaline-earth metal, sodium, potassium and calcium hydroxide, and amines which are soluble in the reaction medium, e.g. lower alkylamines and lower alkanolamines. Preferred catalysts are formic acid and ammonia. The total amount of catalyst may range up to 3 mol/l, for example.

The precondensation step is usually carried out at a temperature ranging from 0° to 90° C., preferably from 10° to 70° C. The period of time needed for completion of the precondensation step is comprised between 0.5 and 48 h, preferably between 4 and 24 h. When solvents are used, the same ranges usually apply, including the boiling temperature of the solvent. However, the reaction is preferably carried out at room temperature. The solvent may be removed from the precondensation medium at the end of the reaction.

Optionally, the precondensation may be carried out by first precondensation of one or more of the starting components, or of part of one, several or all starting components, and by subsequently adding the remaining component(s) or part thereof and thus finally carrying out the process of precondensation, or alternatively the process of the further condensation.

The precondensation is carried out up to a degree of advancement such that the precondensate still shows a liquid consistency.

The subsequent condensation (ii) of the precondensate, optionally as a solution free of solvent, is carried out with substantially the stoichiometric amount required for the hydrolysis of the hydrolysable groups. The term "substantially stoichiometric" is intended to mean the exact stoichiometric amount of water, plus or minus a variation which does not exceed 5%. The stoichiometry, used in the present specification, is calculated based on the starting materials initially used. According to a preferred embodiment, the water is added stepwise.

The condensation (ii) is preferably carried out in the presence of a catalyst, of the type of the one mentioned hereinabove. Preferred catalysts for the condensation (ii) are formic acid and ammonia. The total amount of catalyst may range up to 5 mol/l, for example. During said condensation, one of the previously mentioned organic solvent may be present, either at the beginning of said condensation (ii) if not removed at the completion of the precondensation (i), or it may be added during said condensation. If a solvent is used during the condensation step it may be removed using vacuum.

Condensation (ii) is carried out at a temperature comprised between 0° and 100° C., preferably between 20° and 80° C., and for a period of time comprised between 1 and 72 h, preferably 4 and 16 h. The reaction parameters, particularly the reaction time, are adjusted as a function of the nature of the starting materials, the reaction conditions of the precondensation, the temperature of the condensation, and the desired viscosity of the lacquer to be obtained. Typically, the condensation is continued so as to obtain the desired inherent viscosity for the lacquer. Preferably, said inherent viscosity is comprised between 5 and 1000 mm$^2$/s. This viscosity is chosen so as to allow the lacquer to be easily processed, i.e. to be easily applied to the subject substrate. The viscosity is measured according to known methods, such as capillary viscosimetry.

The lacquer may be used as such for the coating, or it may contain additional additives. These additives are usual, and include but are not limited to: organic diluents, anti-sagging adjuvant, pigments, dyes, UV-stabilisant, viscosity-regulator, anti-oxidant, fillers. Preferably, the lacquer contains fillers, such as: clay, calcinated clay, Aerosil®, α-calcit, glass fibers, glass flakes, talc, and the like. The filler may represent from 1 to 70 weight %, based on the weight of the lacquer. Preferred fillers are Luzenac talc and glass fibers, which may be incorporated in the lacquer prior to coating or sprinkled thereon once coated.

There is no specific requirement as to when the lacquer has to be processed, since the time limit is about 15 years after completion of the condensation reaction; preferably it is applied within 250 days after the end of the condensation. This requirement is due to the variation of viscosity. Alternatively, the lacquer may be obtained step-wise, i.e. by carrying out the precondensation and the condensation at two different moments; in this case, care should be taken to store the precondensate in a water-free environment and at a low temperature so that the condensation reaction cannot start.

According to another embodiment, the lacquer can be stored free of solvent, the solvent being removed by, distillation. If necessary, a solvent and/or a reactive diluent can be added before application to adjust the viscosity. The solvent is the usual solvent (e.g. propanol, butoxyethanol, propoxyacetate). The reactive diluent is, e.g., styrene oxide, phenyl glycidyl ether, neopentylglycol diglycidyl ether, and is incorporated with advantage into the organic network during the curing process.

Another object of the invention is a process for the obtention of a coating on a substrate which comprises the steps of applying a lacquer according to the present invention on said substrate and curing said lacquer.

The lacquer is applied according to known methods. Examples of said usual methods for applying a lacquer are: brushing, printing, screen-printing, dip-coating followed by spinning-off, soaking, spraying and the like. The method for applying the lacquer is determined based on the viscosity of the lacquer and the substrate to be coated, or alternatively the viscosity of the lacquer may be adjusted in order to be processed in the specific process used in the plant. Also, the component may not need to be coated on all its sides: for example, a cubic substrate which needs to be coated on two sides only can be coated on these sides only using the method which is best suited; this is the case for SMDs such as thin-film capacitors which present two main oxidable faces. The lacquer thus applied is then cured in order to gain its remarkable properties.

The step subsequent to the condensation is the curing of the condensate of step (ii). This curing is the polymerization of the polymerizable group Y of the organic network former b). This polymerization may be a radical photopolymerization, a thermal and/or hardener polymerization.

The curing may be initiated either by thermal treatment and/or by hardeners, i.e. curing agents. The hardeners may be used along with catalysts. Suitable hardeners are those commonly used, for examples organic peroxides such as diacyl peroxides, e.g. benzoyl and lauroyl peroxide; ketone peroxides e.g. acetone and cyclohexanone peroxides; hydrocarbon peroxides, e.g. tert-butyl, cumyl, decahydronaphthyl peroxides; dihydrocarbyl peroxides e.g. di-tert-butyl and dicumyl peroxides; percetals e.g. 1,1-di-tert-butylperoxy-3,3,5-trimethylcyclohexane; peresters e.g. tert-butylperbenzoate, tert-butylperoxyisopropyl-percarbonate, bis(4-tert-butylcyclohexyl)peroxydicarbonate, butyl and cyclohexyl percarbonate, bicyclohexyl peroxydicarbonate, tert-butyl perpivalate, tert-butyl peroctoate and tert-butyl permaleate; as well as acetylcyclohexane sulfonyl peroxide. Usual azoic initiators, such as azobisisobutyronitrile, and conventional primary and secondary aliphatic or aromatic amines, e.g. diethylenetriamine, are suitable as well. The boron trifluoride monoethylamine complex may also be used as hardener. Anhydrides, such as hexahydrophthalic acid anhydride, are also appropriate; in the case of hexahydrophthalic acid anhydride, N-benzyldimethylamine is advantageously used as catalyst. Halogenated antimony, e.b. SbF$_6$, may also be used. The type of hardeners defends upon the functionality to be polymerised. If the functionality is a double bond C=C, the hardener is usually a peroxy compound. If the functionality is an epoxy, the hardener is an amine, $SbF_6$, hexahydrophthalic acid anhydride/N-benzyldimethylamine, or boron trifluoride monoethyl amine complex. For the curing of epoxy, preferred hardeners are anhydride/amine and boron trifluoride. The amount of hardener may range widely; in case of epoxy curing it may range from 1 to 100%, based on the epoxy content, preferably from 5 to 50%. When catalysts are used along with hardeners, they may represent from 0,01 to 100 wt % preferably 5%, based on the weight of hardener.

The thermal curing, with or without hardener, is carried out at a temperature comprised 20 and 200° C., preferably 50° and 150° C. The curing time may vary widely; usually it is comprised between 10 mn and 72 hours, preferably between 0,5 and 20 hours. The thermal curing may be carried out under vacuum, optionally.

The photocuring may be an IR-curing, an UV-curing, or any suitable photocuring, e.g. a curing acting under actinic radiation, and the like. Preferably, the photocuring is UV-curing. In this latter case, initiators UV-activated are suitable. Examples of said initiators are: 1-hydroxy-cyclohexylphenylketone, benzyldimethylcetal, 2-hydroxy-2-methyl-1-propanone, butyl oxide, benzoine oxide, ethyl oxide, benzophenone, benzoine, substituted thioxanthones and ionic photoinitiators like triarylsulfoniumhexafluoro-phosphate and -antimonate salts (e.g. Cyracure UVI 6974 from Union Carbide). A preferred UV-initiator is 1-hydroxy-cyclohexyl-phenylketone, for the curing of (meth)acryloxy functionalities of the group 5 Y of component b). The 1-hydroxy-cyclohexylphenylketone is commercially available under the tradename IRGACURE 184 (Ciba-Geigy company).

The amount of thermal or UV-curing initiator is comprised between 0.01 to 5 wt %, based on the weight of the lacquer; it may also be calculated based on the content of polymerizable groups, as state hereinabove. Accelerators may also be added to the foregoing. Examples of such accelerators are tertiary amines, preferably N-methyldiethanolamine. The amount of said accelerator is comprised between 10 and 300 wt %, preferably 50 and 200 wt %, based on the weight of the photoinitiator.

According to an embodiment of the present invention, the curing is alternatively thermal and a UV-curing. Different sequences have been found to be efficient. Examples are given below, wherein p means photocuring with IRGA-CURE under UV radiation; and t means thermal curing at 120° C. with anhydride/amine or boron trifluoride. The number between parentheses after t and p stands for the curing time, expressed in hours and minutes, respectively. These examples are given by way of illustration of combining t and p-curing: p(1)-t(16); t(16)-p(1); t(1)-p(1)-t(16); and the like.

According to another embodiment, the curing can be a two-step curing, in that sense that a photocuring is first carried out, so as to enable the coated substrate to be handled, and a thermal curing is then carried out t6 completely cure the lacquer. The first step is quite short, e.g. about 30 seconds, and the coating becomes non-sticky, so that the thus-coated substrate can be easily handled. The lacquer, at this time, is a "precured" lacquer. The second step requires a longer period of time, e.g. 16 hours. Due to the fact, the substrate is non-sticky, there is no requirement of a minimal distance between the substrates places in the oven: there is no risk of sticking together. This embodiment allows easier and faster processing, smaller ovens, and the like.

The coating obtained by the present process has a thickness comprised between 0,1 and 200 µm, preferably between 1 and 150 µm. Before applying the lacquer, the substrate may be coated with a keying agent or with a primary layer or sublayer, although this pre-coating is not required. The coating may also be obtained as a dual layer, the sub-layer being a lacquer with a filler and the external layer being a pure lacquer.

Any substrate may be coated with the present lacquer, and particularly substrates such as SMD, PCB. Examples are: thin-film capacitor, multiple-chip module, resistor, integrated circuit, Si-wafer, optical component. The present lacquers show a very high adhesion on these various substrates, being adherent to metal, polyester, ceramics, and the like.

Thus, another object of the present invention is to provide substrates having applied thereon a coating obtained by the present process. Also, the present coating process may alternatively be expressed as the use of the present lacquer as coating.

The present invention is now described in more details in the following examples, which have to be understood as illustrative of the scope of the invention and in no case as limiting said scope, defined in the appended claims.

EXAMPLE 1

Synthesis of GMP2T

The preparation of system GMP2T is described for a 0.4 mol formulation:

94.45 g (0.4 mol, 38.6 mol %) GLYMO (3-glycidyloxypropyltrimethoxysilane from the company Union Carbide)

99.24 g (0. 4 mol, 38.6 mol %) MEMO (3-methacryloxypropyltrimethoxysilane from the company Fluka)

41.97 g (0.2 mol, 18.92 mol %) diphenylsilanediol (from the company Fluka)

8.33 g (0.04 mol, 3.86 mol %) TEOS (tetraethoxysilane from the company Fluka)

42.62 g (2.37 mol, stoichio.) $H_2O$

Into a 500 ml-three-necked glass flask equipped with a multiple coil condenser, a thermometer and a drop funnel the silanes are weighed in the sequence given above. The milky reaction mixture is stirred magnetically for a period of 18 hours at room temperature. Then, within about 90 min., the suspension is heated up to an internal temperature of about 70° C. maximum by using an heating mantle. The composition becomes clear and a fourth (about 10 ml) of the stoichiometric amount of water, weighed into the drop funnel, is added in a single step without removing the external heating. The resulting suspension, the temperature of which decreases by about 4°–5° C., is vigorously stirred until clearness occured (after about 2 min.). Then, at a rhythm of 20 min. a quarter (about 10 ml) of the stoichiometric amount of water at a time is added to the mixture the temperature of which is kept at about 70° C. When the lacquer becomes clear after the last addition of water (after 20–30 min.) the composition is stirred while being kept heated for a further hour (about 69° C.). After removing the heating mantle the clear lacquer is slowly cooled down to room temperature.

After storage for 14 days at 20° C. (climatized chamber) the lacquer GMP2T is fit for application. At that time the inherent viscosity is about 11 $mm^2/s$ (determined by an Ubbelohde capillary viscosimeter at 20° C.).

EXAMPLE 2

In 10 g of the GMP2T lacquer as prepared in example 1 above (54% solid content), 0.2 g of Irgacure 184 (Ciba-Geigy) is dissolved. Thin-film PET-capacitors are dipped in this solution. A spin-off process (40 s, 600 rpm) follows. Curing is obtained by illumination with a 1000 W medium-pressure Hg-lamp (Loctite) for 30 s, followed by heating at 120° C. for 16 h. The thus-obtained coating has a thickness of about 5 µm.

EXAMPLE 3

In 10 g of the GMP2T lacquer as prepared in example 1 above, 1,22 g hexahydrophthalic acid anhydride (50 mol % based on the epoxy content of the lacquer) and 0,061 g N-benzyldimethylamine (5 wt % based on the acid anhydride) are dissolved. Thin-film PET-capacitors are dipped in this solution. A 0 spin-off process (40 s, 600 rpm) follows. Curing is obtained by heating at 120° C. for 16 h. The thus obtained coating has a thickness of about 5 µm. After temperature cycling (−55° C. for 30 mn/+125° C. for 30 mn) for three times, no crack formation is observed in the coating layer. Storing the capacitors in humid conditions (40° C., 100% RH) leads to a begin of capacitance decrease for the coated chips after about 250 days. In contrast, uncoated chips show a decrease after 130 days with a decreasing rate much higher.

EXAMPLE 4

The solvent of the GMP2T lacquer as prepared in example 1 above is removed by evaporation under reduced pressure. 54 g of solvent-free lacquer are heated up to 40° C. and 1,22 g of hexahydrophthalic acid anhydride and 0,061 g of N-benzyldimethylamine are dissolved. Printed circuit boards (PCB based on FR-4 laminates) with capacitors, resistors and encapsulated integrated circuits are dipped into the lacquer. The PCBs are driven out of the lacquer bath at a velocity of 5 cm/mn. Curing is performed at 120° C. for 16 h. The coating layer has a thickness of about 20 µm. All components as well as the substrate are well covered by the coating. Further, a cleaning of the substrate before applying the coating is not necessary. If the PCB contains components (e.g. electrolytic capacitors) which cannot withstand 120° C., 3,3 mol % based on the epoxy content) are used instead of hexahydrophthalic acid anhydride and N-benzyldimethylamine. Curing is then performed at 80° C. during 1 h. Also in this case a cleaning of the PCBs is not necessary.

EXAMPLE 5

In 10 g of solvent-free GMP2T lacquer (as in example 3), 10 g of n-propylacetate and 1 g Cyracure UVI 6974 (Union Carbide) and 1 g N-methyldiethanolamine are added. The solution is applied to Si-wafers by dipping followed by spin-off processing (1600 rpm for 30 s). The coated Si-wafer is subsequently kept at 120° C. for 1 h. The coating layer has a thickness of about 12 µm, and a very smooth surface; adhesion to Si is very high.

EXAMPLE 6

Figure 1B:
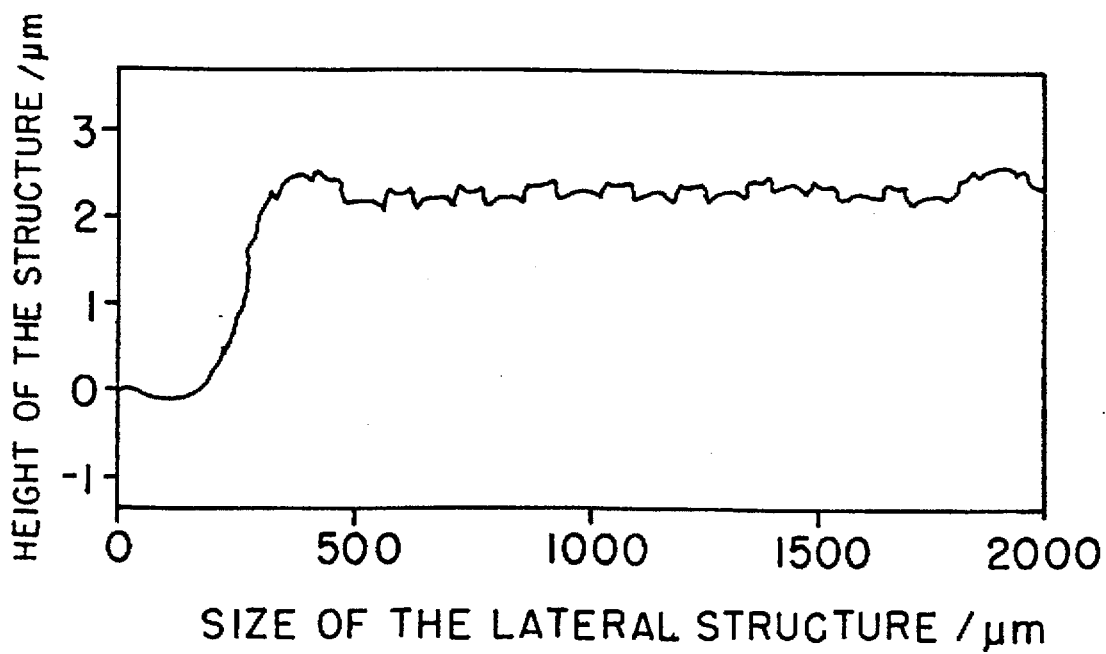

In 10 g of GMP2T lacquer, 0,5 g Darocur 4263 (Merck) and 0,5 g N-methyldiethanolamine are added. $Al_2O_3$-ceramic boards with Cu- and Au-conductor lines (3–4 µm height) are coated with this lacquer by dipping followed by spinning-off (1600 rpm, 30 s). The applied coating layer is cured by UV-radiation (400 nm, 13 mW/cm$^2$) for 5 mn and then post-baked at 120° C. for 16 h. The copper and gold conductors are nearly totally planarized as can be seen in FIG. 1, wherein FIG. 1a relates to uncoated boards whereas FIG. 1b relates to coated boards.

EXAMPLE 7

Figure 2:
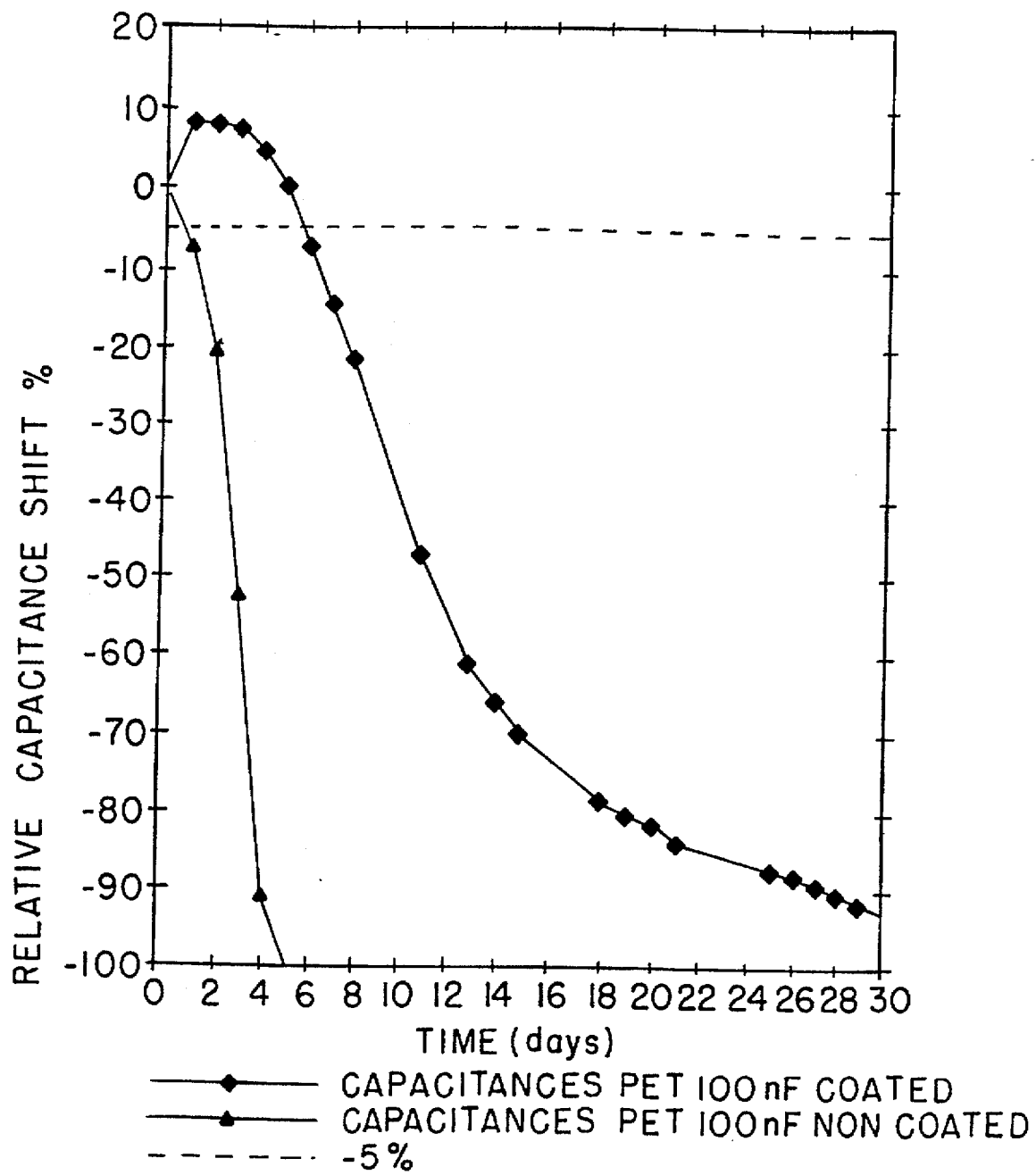
FIG. 2 shows the relative capacitance shifts for coated and uncoated 100 nF PET-capacitors in a 90° C., 100% RH life test.

In 10 g of the GMP2T lacquer as prepared in example 1 above, 1,22 g hexahyrophthalic acid anhydride (50 mol % based on the epoxy content of the lacquer) and 0.061 g N-benzyldimethylamine (5 wt % based on the acid anhydride) are dissolved. Thin-film PET-capacitors (100 nF) are dipped in this solution. A spin-off process follows. Curing is obtained by heating at 120° C. for 12 h. The thus obtained coating has a thickness of about 30 µm. Testing under humid conditions (90° C./100%RH; no voltage is applied) shows a beginning of capacitance decrease after 5 days for coated capacitors whereas for uncoated ones the decrease starts after 1 day. See FIG. 2, which shows relative capacitance shift versus time. In order to be acceptable, a capacitor has to withstand the humid conditions as above for 3 days.

EXAMPLE 8

25, 50, 60, 70% by weight of Luzenac talc were mixed with the GMP2T lacquer as prepared above, and applied as described above. Hardening was carried out with $BF_3$-ethylamine complex (50% mol.) using the following sequence: 1 hour thermal (120° C.)—1 min. UV—16 hours thermal (120°). This coating was tested on 450 nF capacitors in a damp atmosphere (40° C./100% RH). Capacity variation wasn't noticeable until after 130 days.

EXAMPLE 9

Two layers of lacquer, the first containing filler, and the second also able to contain a second filler were applied. The system was the GMP2T system. The first layer was prehardened at 120° C. for 1 hour, then the second layer was applied and thermal hardening continued for 1 hour at 120° , after which photohardening (1 min/500 W) was followed by thermal hardening (120° C./16 hours). 450 nF capacitors were tested in a damp atmosphere (40° C., 100% RH) for different systems, the amount of filler being 50%. These systems were studied: GMP2T+glass/GMP2T; GMP2T+talc/GMP2T; GMP2T+glass/GMP2T+talc; All tests showed they stood up to at least 150 days at 40° C./100% RH conditions.

EXAMPLE 10

To 10 g of solvent-free GMP2T lacquer (as in example 3), stored solvent-free for 2 months, 10.8 g of neopentyl glycol diglycidyl ether (NPGGE) and 5.5 g of diethylenetriamine are added. The addition of NPGGE lowers the viscosity of the lacquer by a factor of 1.8. The system is applied to a PCB (see example 3) by spray coating with an air-brush. The curing is performed at 80° C. during 0.5 h. The applied coating has a thickness of about 8 µm. The coated PCB shows good withstandess against wet climate conditions (>1500 h at 40° C. and 95% tel. humidity).

PROPERTIES

Some of the properties the new lacquer is endowed with are given below.

Good adhesion to substrate:

The present coating shows good adhesion to various substrates. The adhesion is measured with cross-cut tape test for coatings 10 μm thick according to the method DIN 53151. The scale ranges from 0 to 5; for example, the adhesion on Al$_2$O$_3$-ceramic, Si-wafer, flat glass, Cu, Al, stainless steel is comprised within the respectives ranges of: 0–1; 1–2; 1–2; 0–1; 0–1; 0–1. Further, the coating wets PET and PEN, the polyester constituting thin-film capacitors with wetting angles less than 20°.

Thermal stability:

The coating has been applied to Al and heated in steps of 1 hour at 150° C., 180° C., 210° C., 240° C., 270° C. and 300° C. No crack formation or color change appears until up to the highest temperature. A particular immersion for 30 s in a bath of molten solder at 280° C. does not affect the material properties.

Electrical properties:

The breakdown strength is about 400 V/μm, as measured on copper; the dielectric constant (ε at 1 kHz) is about 3.2, Tan δ (1 kHz) is less than $1.10^{-3}$. The bulk resistivity is greater than $10^{16}$ Ω.cm.

Contaminants:

The present coating has a very low alkali content (as low as 10 ppm). The presence of contaminants being one factor that contributes to electrode erosion and corrosion, the present coatinsg are less susceptible to corrode.

Chemicals:

The present coating resists commonly used industrial solvents and detergents.

Behaviour towards water:

The water absorption is less than 0,5% and the water vapor permeation rate (WVPR) is less than 3 g/m$^2$d, as measured for a 100 μm thick coating. Water is an important factor for corrosion and the low WVPR of the present coating thus reduces corrosion.

Long shelf-life:

Shelf-lives of more than 200 days are obtainable. This is an advantage compared to conventional epoxy systems which need to be procesed within a short period of time after completion of the reaction.

Viscosity:

Component miniaturisation requires that coatings applied to the chip should be very thin, typically less than 100 μm. Possible application technologies for capacitors include dip-coating (eventually followed by spinning off excess material), screen-printing or coating of the cut-edges by a dip process similar to the one used to apply the conducting paste as electrodes on ceramic chips. Different technologies require different viscosities of the starting material. The viscosity of the present lacquer can easily be adapted to these requirements.

We claim:

1. A process for making a lacquer comprising the steps of:
    (i) precondensing:
    a) 1 to 10 mol % of at least one silicon compound of the formula I:

$$SiR_4 \quad (I)$$

wherein:
    R is halogen, hydroxy, alkoxy, acyloxy or chelated ligand;
    b) 69 to 83 mol % of at least one organic silane of the formula II:

$$R''_m(R'''Y)_nSiX_{(4-m-n)} \quad (II)$$

wherein:

R" is alkyl, alkenyl, aryl, alkylaryl, arylalkyl, alkenylaryl, arylalkenyl;
    R'" is alkylene, alkenylene, arylene, alkyl-arylene, aryl-alkylene, alkenyl-arylene, aryl-alkenylene;
    R" and R'" being optionally interrupted by oxygen, sulfur or —NH—;
    X is hydrogen, halogen, hydroxy, alkoxy, acyloxy, —NR'$_2$ where R' is hydrogen or alkyl;
    Y is a polymerizable group;
    m, an integer from 0 to 3; n is an integer from 1–3; m+n is from 1 to 3; and
    c) 15 to 25 mol % of at least one organic silane of formula III:

$$R''_pSiX_{4-p} \quad (III)$$

wherein R" and X are defined in b), and p is 1, 2 or 3; and
    d) 0 to 10 mol % of at least one low-volatility metal oxide, soluble in the precondensation reaction medium, of an element of groups Ia to Va or IVb or Vb of the Periodic Table of the Elements, or a compound of one of these elements, soluble in the reaction medium, forming a low-volatility oxide; selectively in the presence of an organic solvent, at a temperature of between about 0° and about 90° C. for a period of time ranging from between about 0.5 and about 48 hours; and
    ii) condensing by hydrolysis, the precondensate of step (i) with substantially the stoichiometric amount of water, at a temperature of between about 0° and about 100° C. for a period of time ranging from between about 1 and about 72 hours.

2. The process according to claim 1 wherein the precondensation of step (i) is carried out in the absence of water.

3. The process according to claim 1 wherein the component a) of formula I represents from 2 to 6 mol %, and the component d) represents 0 mol %.

4. The process according to claim 1 wherein component a) of formula I is Si(OC$_2$H$_5$)$_4$.

5. The process according to claim 1 wherein component b) of formula II is (R'"Y)SiX$_3$, wherein R'" is a C$_{1-4}$ alkylene, Y is acryloxy, methacryloxy, glycidyloxy, allyl, vinyl or epoxycyclohexyl, and X is C$_{1-4}$ alkoxy.

6. The process according to claim 5 wherein component b) of formula II is 3-glycidyloxypropyltrimethoxysilane (glymo) and/or 3-methacryloxypropyltrimethoxysilane (memo).

7. The process according to claim 1 wherein component c) of formula III is R"$_2$SiX$_2$, wherein R" is an aryl and X is hydroxy or C$_{1-4}$ alkoxy.

8. The process according to claim 7 wherein component c) is (C$_6$H$_5$)$_2$Si(OH)$_2$.

9. The process according to claim 1 wherein component a) is Si(OC$_2$H$_5$)$_4$; component b) is (R'"Y)SiX$_3$, wherein R'" is a C$_{1-4}$ alkylene, Y is acryloxy, methacryloxy, glycidyloxy, allyl, vinyl or epoxycyclohexyl, and X is C$_{1-4}$ alkoxy; and component c) is R"$_2$SiX$_2$, wherein R" is aryl and X is hydroxy or C$_{1-4}$ alkoxy.

10. The process according to claim 1 wherein the precondensation step (i) is carried out in the absence of external solvent.

11. The process according to claim 1 in which the precondensation of step (i) and/or the condensation of step (ii) is carried out catalytically.

12. The process according to claim 1 wherein the precondensation of step (i) is carried out at a temperature of between about 10° and about 70° C. and for a period of time ranging from about 4 to about 24 hours.

13. The process according to claim 12 wherein the condensation of step (ii) is carried out at a temperature of between about 20° and about 80° C. and for a period of time ranging from between about 4 and about 16 hours.

14. The process according to claim 1 wherein the stoichiometric amount of water is added stepwise.

15. The process according to claim 1 wherein the lacquer made by the process has an inherent viscosity ranging from between about 5 and about 1000 mm²/second.

16. The process according to claim 1 which further comprises step (iii) adding additional additives to the precondensate (i) and/or the condensate (ii).

17. The process according to claim 16 wherein the additional additives are fillers added in an amount ranging from about 1 to about 70%, based on the weight of the lacquer.

18. A lacquer obtained by a process comprising the steps of:

(i) precondensing:
  a) 1 to 10 mol % of at least one silicon compound of the formula I:

$SiR_4$                  (I)

wherein:
  R is halogen, hydroxy, alkoxy, acyloxy or chelated ligand;

b) 69 to 83 mol % of at least one organic silane of the formula II:

$R''_m(R'''Y)_nSiX_{(4-m-n)}$          (II)

wherein:
  R" is alkyl, alkenyl, aryl, alkylaryl, arylalkyl, alkenylaryl, arylalkenyl;
  R'" is alkylene, alkenylene, arylene, alkyl-arylene, aryl-alkylene, alkenyl-arylene, aryl-alkenylene;
  R" and R'" being optionally interrupted by oxygen, sulfur or —NH—;
  X is hydrogen, halogen, hydroxy, alkoxy, acyloxy, —NR'₂ where R' is hydrogen or alkyl;
  Y is a polymerizable group;
  m, an integer from 0 to 3; n is an integer from 1–3; m+n is from 1 to 3; and c) 15 to 25 mol % of at least one organic silane of formula III:

$R''_pSiX_{4-p}$             (III)

wherein R" and X are defined in b), and p is 1, 2 or 3; and d) 0 to 10 mol % of at least one low-volatility metal oxide, soluble in the precondensation reaction medium, of an element of groups Ia to Va or IVb or Vb of the Periodic Table of the Elements, or a compound of one of these elements, soluble in the reaction medium, forming a low-volatility oxide; selectively in the presence of an organic solvent, at a temperature of between about 0° and about 90° C. for a period of time ranging from between about 0.5 and about 48 hours; and ii) condensing by hydrolysis, the precondensate of step (i) with substantially the stoichiometric amount of water, at a temperature of between about 0° and about 100° C. for a period of time from between about 1 and about 72 hours.

19. The lacquer according to claim 18 wherein the precondensation of step (i) occurs in the absence of water.

20. The lacquer according to claim 18 wherein the component a) of formula I represents from 2 to 6 mol %, and the component d) represents 0 mol %.

21. The lacquer according to claim 18 wherein component a) of formula I is $Si(OC_2H_5)_4$.

22. The lacquer according to claim 18 wherein component b) of formula II is $(R'''Y)SiX_3$, wherein R'" is a $C_{1-4}$ alkylene, Y is acryloxy, methacryloxy, glycidyloxy, allyl, vinyl or epoxycyclohexyl, and X is $C_{1-4}$ alkoxy.

23. The lacquer according to claim 22 wherein component b) of formula II is 3-glycidyloxypropyltrimethoxysilane (glymo) and/or 3-methacryloxypropyltrimethoxysilane (memo).

24. The lacquer according to claim 18 wherein component c) of formula III is $R''_2SiX_2$, wherein R" is aryl and X is hydroxy or $C_{1-4}$ alkoxy.

25. The lacquer according to claim 24 wherein component c) is $(C_6H_5)_2Si(OH)_2$.

26. The lacquer according to claim 18 wherein component a) is $Si(OC_2H_5)_4$; component b) is $(R'''Y)SiX_3$, wherein R'" is a $C_{1-4}$ alkylene, Y is acryloxy, methacryloxy, glycidyloxy, allyl, vinyl or epoxycyclohexyl, and X is $C_{1-4}$ alkoxy; and component c) is $R''_2SiX_2$, wherein R" is aryl and X is hydroxy or $C_{1-4}$ alkoxy.

27. The lacquer according to claim 18 wherein the precondensation step (i) is carried out in the absence of external solvent.

28. The lacquer according to claim 18 wherein the precondensation of step (i) and/or the condensation of step (ii) is carried out catalytically.

29. The lacquer according to claim 18 wherein the precondensation is carried out at a temperature of between about 10° and about 70° C. and for a period of time ranging from about 4 to about 24 hours.

30. The lacquer according to claim 29 wherein the condensation of step (ii) is carried out at a temperature of between about 20° and 80° C. and for a period of time ranging from between about 4 and about 16 hours.

31. The lacquer according to claim 18 wherein the stoichiometric amount of water is added stepwise.

32. The lacquer according to claim 18 wherein the lacquer has an inherent viscosity ranging from between about 5 and 1000 mm²/second.

33. The lacquer according to claim 18 wherein the lacquer contains additional additives.

34. The lacquer according to claim 33 wherein the lacquer contains from about 1 to about 70% of fillers, based on the weight of the lacquer.

35. The lacquer according to claim 18 which is free of solvent.

36. A process for coating a substrate which comprises the steps of applying on a surface of said substrate the lacquer of claim 18 and curing the lacquer.

37. The process according to claim 36 wherein the curing is a thermal curing, carried out at a temperature ranging from between about 20° and about 200° C., for a period of time ranging from between about 10 minutes and 72 hours.

38. The process according to claim 37 wherein the curing is carried out in the presence of hardeners.

39. The process according to claim 36 wherein the curing is photocuring, carried out in the presence of a photoinitiator for a period of time ranging from between about 2 seconds and 10 minutes.

40. The process according to claim 36 wherein the curing is a thermal and a photocuring.

41. The process according to claim 36 wherein the curing is comprised of steps of photocuring followed by thermal curing.

42. The process according to claim 36 wherein the lacquer is applied by a method comprising the further steps of dip-coating the substrate in the lacquer and spinning-off some of the lacquer.

43. The process according to claim 36 wherein the thickness of the coating ranges from between about 0.1 and about 200 microns.

44. The process according to claim 43 wherein the thickness of the coating ranges from between about 1 and about 150 microns.

45. A substrate comprising at least one surface having a coating applied thereon, the coating comprising the lacquer of claim 18.

46. The substrate according to claim 45 which is a surface mounted device.

47. The substrate according to claim 46 which is mounted on a printed circuit board.

48. The substrate according to claim 45 which Is a thin film capacitor.

49. The substrate according to claim 45 which is a multiple chip module.

50. The substrate according to claim 45 which is an optical component.

51. The substrate according to claim 45 which is a resistor.

52. The substrate according to claim 45 which is an integrated circuit, optionally encapsulated.

53. The substrate according to claim 45 which is a silicon-wafer.

54. The substrate according to claim 45 which is a printed circuit board.

55. The process according to claim 1 comprising the further step of applying the lacquer to a thin film capacitor.

* * * * *